United States Patent [19]

Conway et al.

[11] 4,041,288

[45] Aug. 9, 1977

[54] VOLTAGE LEVEL DISPLAY CIRCUIT

[75] Inventors: Arch W. Conway, Mission Viego; Nelson Urdaneta, La Verne, both of Calif.

[73] Assignee: Dana Laboratories, Inc., Irvine, Calif.

[21] Appl. No.: 723,405

[22] Filed: Sept. 15, 1976

[51] Int. Cl.² .......................................... G01R 13/00
[52] U.S. Cl. .................... 235/151.31; 235/92 EL; 307/362; 324/99 R; 364/900
[58] Field of Search ............... 235/151.31, 150.5, 198, 235/171, 92 EL, 92 CA, 92 MT; 340/324 R, 347 AD, 172.5; 324/99 R, 99 D, 100, 113, 121 R; 328/146, 148; 307/360, 362

[56] References Cited

U.S. PATENT DOCUMENTS

| | | | |
|---|---|---|---|
| 3,496,562 | 2/1970 | Smith | 307/360 X |
| 3,838,413 | 9/1974 | Wehrmann | 235/150.5 X |
| 3,869,667 | 3/1975 | Canicatti | 324/113 |

OTHER PUBLICATIONS

Analogue Voltages Monitored by Microprocessor; J. Kaufmann; Electronic Engineering, vol. 48, No. 580, June 1976, pp. 23, 25, 27.
Built-in Microprocessor Available in Scope; News Scope, Sept. 27, 1974, p. 25.
Voltage Comparator Circuit; C. D. Driscoll; IBM Technical Disclosure Bulletin; vol. 17, No. 4, Sept. 1974, pp. 1151-1152.

*Primary Examiner*—Edward J. Wise
*Attorney, Agent, or Firm*—Nilsson, Robbins, Dalgarn & Berliner

[57] ABSTRACT

A voltage level display circuit for providing a display of the magnitude of the reference voltage level to a comparator circuit. A microprocessor is responsive to an input command signal to generate a digital reference voltage level which is converted by a digital to analog converter to an analog signal which is coupled to a reference voltage input of a comparator which compares the reference voltage level with an applied signal. A digital display is coupled to the output of the microprocessor to simultaneously provide a visual indication of the output of the microprocessor while generating the digital reference voltage signal.

10 Claims, 4 Drawing Figures

VOLTAGE LEVEL DISPLAY CIRCUIT

BACKGROUND OF THE INVENTION

The present invention relates to a voltage level display circuit and more particularly to a circuit for providing a display of the magnitude of a reference voltage input level to a comparator circuit.

Various instruments are used for measuring the voltage-time characteristics of an applied signal having a magnitude that varies as a function of time. Such devices measure the time displacement between the point of time at which the applied signal passes one reference voltage level and the point of time at which the applied signal pasess a second reference voltage level. These devices include a comparator with the applied signal coupled to one input and a reference voltage signal coupled to the second input. The comparator produces a transition in output state when the magnitude of the applied signal exceeds the magnitude of the reference voltage level.

Such devices typically include two channels, each having a comparator having an applied input signal and a reference voltage input signal. The comparator of the first channel provides a transition in output state when the applied signal passes the reference voltage level of the first comparator and the comparator of the second channel provides a second transition in output state when the applied signal passes the reference voltage level of the second comparator.

The output of the first comparator may be coupled to a suitable counter to initiate the counting of regularly recurring time pulses and the output of the second comparator may be coupled to the counter to terminate the counting of the pulses. The time displacements between the point of time at which the applied signal passes the first reference voltage level and the point of time at which the applied signal passes the second reference voltage level may be obtained by counting the pulses and multiplying the pulses by the period of each pulse.

Alternatively, a first applied signal may be coupled to the signal input of the comparator of the first channel and a second applied signal may be applied to the signal input of the second channel. The time period between the point of time at which the first applied signal passes the reference voltage level associated with the first channel and the point of time at which the second applied signal passes the reference voltage level associated with the second channel may be obtained by the pulse counting technique described above.

A microprocessor is used to provide a start digital signal corresponding to the desired reference voltage, which is coupled to a digital to analog converter in the first channel and a stop digital signal corresponding to the desired second reference voltage level is coupled to a digital to analog signal in the second channel. The start digital signal produced by the microprocessor is transmitted to a digital to analog converter in the first channel which converts the digital start signal to an analog reference voltage level and couples it to the reference voltage level input of the comparator of the first channel. The reference voltage level input to the comparator in the first channel is compared with the applied signal and the comparator provides a transition in output state when the applied signal passes the reference voltage level to thereby initiate a counting function.

The stop signal produced by the microprocessor is transmitted to a digital to analog converter in the second channel which converts the digital start signal to an analog signal and couples it to a reference voltage input level to the comparator of the second channel. When the applied signal coupled to the input of the comparator of the second channel passes the magnitude of the stop reference voltage level, the second comparator provides a transition in output state which is also coupled to the counter to terminate the counting function. Thus, the time displacement between the point of time at which the applied signal passes the start reference voltage level and the point of time at which the applied signal passes the stop reference voltage level may be measured by multiplying the number of pulses by the period of pulses.

In order to observe the magnitude of the start reference voltage level and the stop reference voltage level, various prior art devices have provided a digital voltmeter connected to the reference voltage level input of the comparator of each channel. The output of the digital voltmeter is applied to a display which displays the reference voltage input signal to each channel.

The requirement of a digital voltmeter for purposes of displaying the start reference voltage signal and the stop reference voltage signal increases the expense of the equipment substantially. Furthermore, it increases the complexity of the equipment and therefore the susceptibility of the device to error.

SUMMARY OF THE INVENTION

The present invention provides a voltage level display circuit for displaying the reference voltage level applied to a comparator in an instrument for measuring the voltage-time characteristics of an applied signal without the use of a voltmeter. To achieve this, a suitable computing device such as a microprocessor which receives reference voltage level commands from an internal or external control source generates a digital signal directly to display means for displaying the reference voltage level command while at the same time transmitting the reference voltage signal to an associated channel having a digital to analog converter and a comparator.

The control signal for controlling the microprocessor may be provided from an internal keyboard or an external controller. The microprocessor, which is well known in the art, transmits a digital start reference voltage signal to a first channel having a digital to analog converter which converts the digital signal to an analog voltage reference level and applies it to the voltage reference input of a comparator in the first channel. Simultaneously, the microprocessor transmits the start reference signal to a start display mechanism which enables a user to visually observe the start reference voltage level.

The keyboard or controller is activated to transmit to the microprocessor a stop reference voltage level which is transmitted digitally to a digital to analog converter in the second channel which also converts the digital stop reference voltage signal to an analog signal and applies it to the voltage reference level input of the comparator of the second channel. Simultaneously, the microprocessor transmits the stop reference voltage signal to a second stop display for providing a visual indication of the reference voltage level applied to the input comparator of the second channel.

Thus, the voltage level display circuit of the present invention provides a visual display of the reference input signal to the first start channel as well as a visual display of the reference input to the second stop channel without requiring any additional voltmeter apparatus.

DETAILED DESCRIPTION OF THE PREFERRED EMBODIMENT

Figure 1:
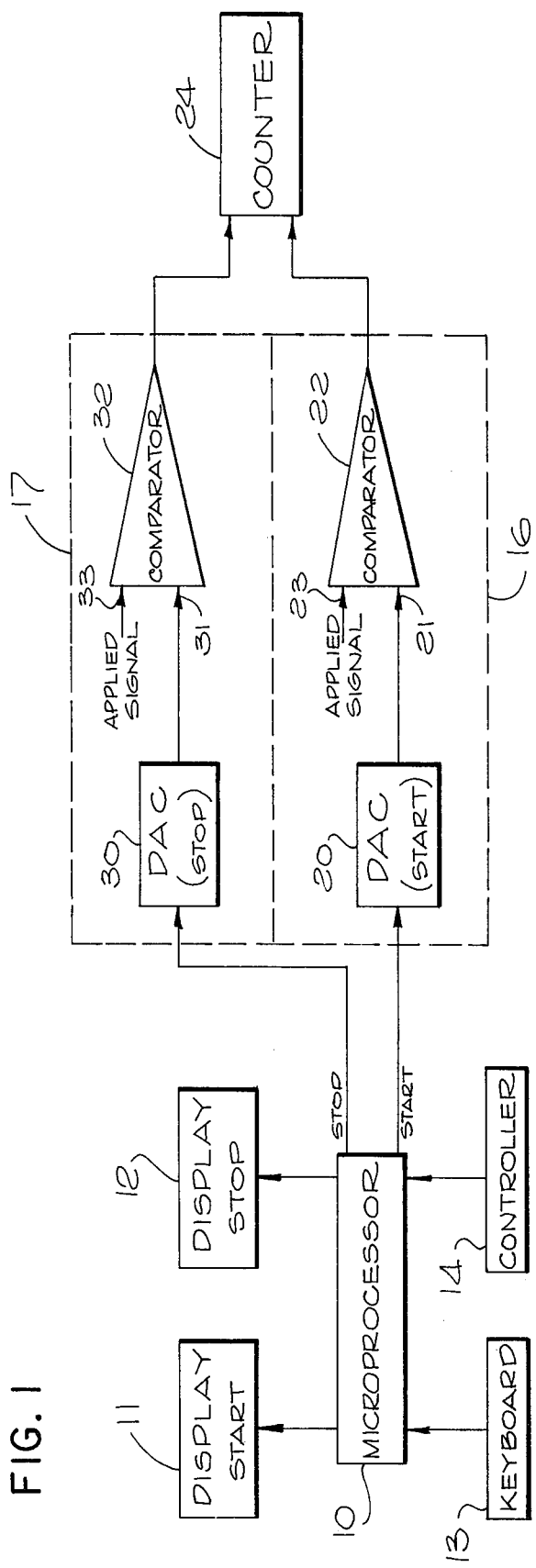
FIG. 1 is a block diagram of an instrument for measuring the voltage-time characteristics of an applied signal including the voltage level display of the present invention.

As shown in FIG. 1, a microprocessor 10 is controlled to provide a start digital output signal and a stop digital output signal which are coupled to separate channels and are simultaneously coupled to a start display 11 and a stop display 12. The simultaneous application of the start reference voltage signal and the stop reference voltage signal to their respective associated channels as well as their respective associated displays 11 and 12 eliminates the necessity of a voltmeter coupled from the channel to the display as required in similarly employed prior art devices.

The microprocessor 10 is controlled by either a keyboard 13 or a suitable controller 14 for providing an input command signal to establish the start reference voltage level and the stop reference voltage level.

The start reference voltage level is generated by the microprocessor 10 in the form of a digital code word or number which is transmitted to a first channel 16 and the stop reference voltage signal in the form of a digital code word or number which is transmitted to a second channel 17.

The first channel 16 includes a digital to analog converter 20 for converting the digital start signal to an analog voltage level and applying it to a reference voltage level input 21 of a comparator 22 with an applied signal coupled to the input 23 of the comparator 22. When the applied signal passes the reference voltage level applied to input terminal 21 of comparator 22, the comparator provides a transition in output state which is coupled to a counter 24 to initiate a counting function of regularly recurring pulses.

The stop reference voltage signal which is transmitted in digital form from the microprocessor 10 into the second channel 17 is applied to the digital to analog converter 30 which also converts it to an analog signal and applies it to the reference voltage input terminal 31 of the comparator 32. The applied signal is coupled to the applied signal input 33 and when the applied signal passes the voltage level corresponding to the stop reference voltage level applied to terminal 31, the comparator 32 generates a transition in output state which is coupled to counter 24 to terminate the count of regularly recurring pulses.

The time between the point of time at which the applied signal passes the start reference voltage level and the point of time at which the applied signal passes the stop reference voltage level may be obtained by multiplying the number of pulses counted by counter 24 by the period of the regularly recurring pulses. Thus, the device as shown in FIG. 1 measures the voltage-time characteristics of the applied signal whose magnitude varies as a function of time. It will be apparent that the applied signal to terminal 23 need not necessarily be the same applied signal transmitted to applied signal input terminal 33. Furthermore, any suitable computer device may be used in place of the microprocessor 10.

Figure 2:
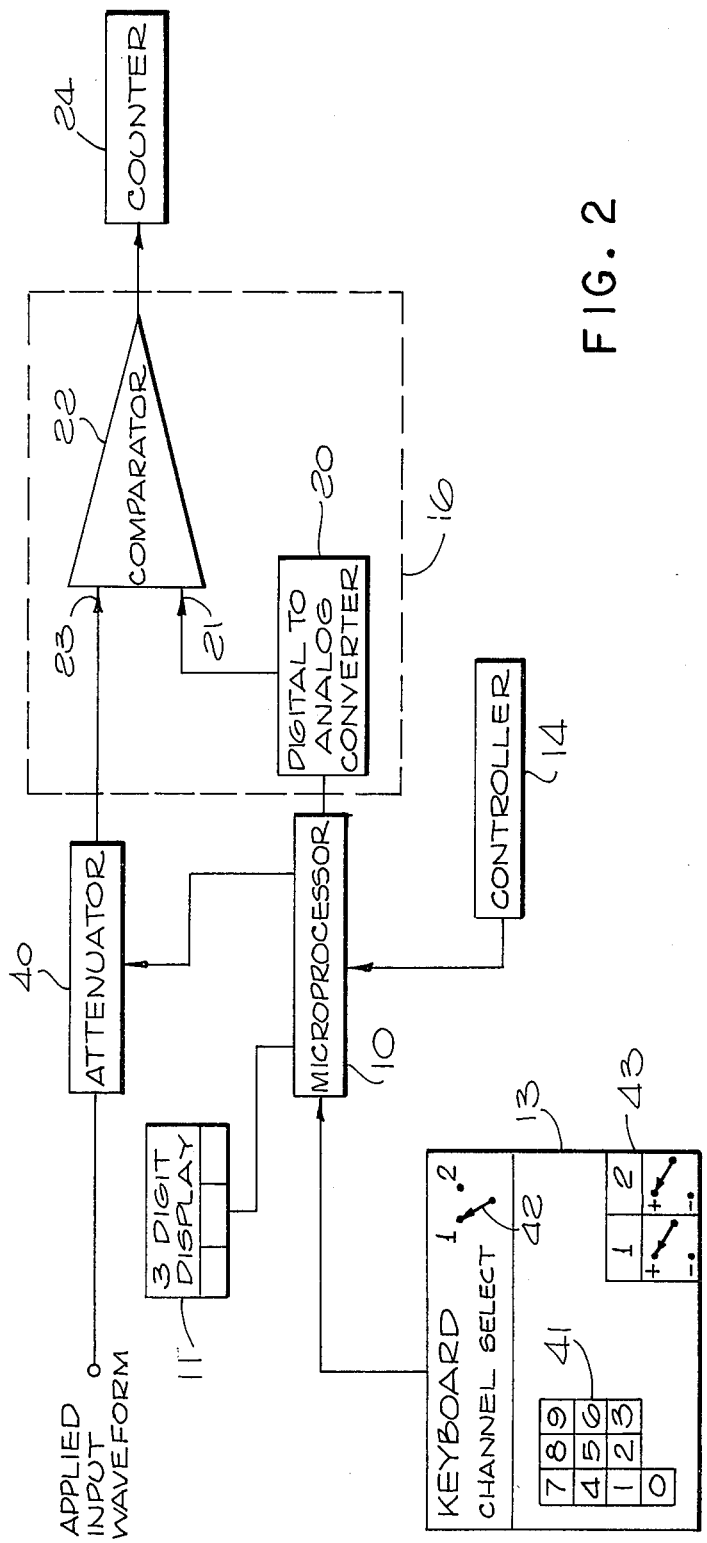
FIG. 2 is a detailed block diagram of each channel of the present invention.

A more detailed block diagram of exemplary channel 16 coupled to the microprocessor 10 is shown in FIG. 2. The microprocessor 10 is coupled to an attenuator 40 which is programmable to scale down large time varying applied input wave forms so as to increase the range of comparator 22.

The keyboard 13 is shown having a plurality of keys 41 for selecting the reference voltage level and keyboard channel select switch 42 for determining to which channel the reference voltage is to be applied.

The keyboard 13 also includes a slope annunciator circuit 43 for controlling the microprocessor 10 to control the reference digital signal to, in turn, control the comparator 22 to provide a transition when the applied input signal either decreases past the reference voltage level or increases past the reference input signal.

Alternatively, the microprocessor 10 may be controlled by the controller 14, as indicated above, to provide the reference input signal. The digital output signal from the microprocessor 10 is coupled, as indicated above, to the digital to analog converter 20 and simultaneously to the display 11 to provide a visual indication of the reference input signal to the input terminal 21 of comparator 22 without requiring any voltmeter coupled to the output of the digital to analog converter 20 as is required by similarly employed prior art devices. The display 11 may be any suitable digital display such as a three digit display using light emitting diodes (LED's).

Figure 3:
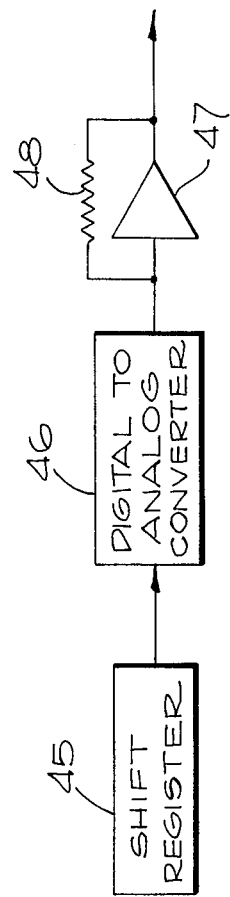
FIG. 3 is a detailed block diagram of the digital to analog converter shown in FIG. 1.

The digital to analog converter of the preferred embodiment is shown in block diagram form in FIG. 3. The digital to analog converter receives the voltage reference level in the form of a digital code word applied serially to shift register 45 which converts the code word to parallel digital form and applies it to a digital to analog converter 46 which converts the digital code word to a current having a magnitude proportional to the numerical magnitude of the digital code word. The output of the digital to analog converter 46 is coupled to the input of an operational amplifier 47 having a feedback loop including a feedback resistor 48 for providing a voltage level proportional to the output current from the digital to analog converter 46.

Figure 4:
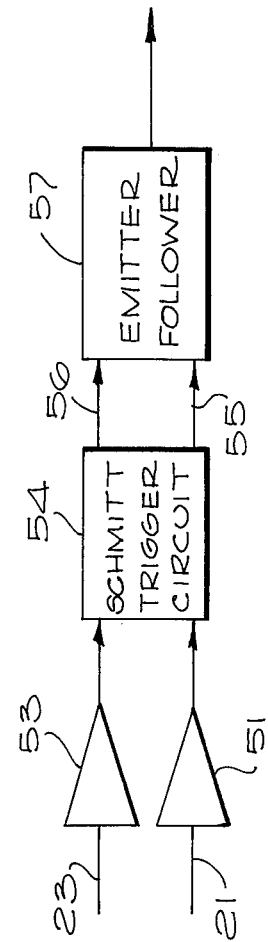
FIG. 4 is a detailed block diagram of the comparator shown in FIG. 1.

The comparator circuit used in both channels is shown in greater detail in FIG. 4 as exemplary comparator circuit 22 having a reference voltage input 21 coupled to an input amplifier 51 and an applied signal input coupled at terminal 23 to amplifier 53. The amplifiers 51 and 53 are coupled to a Schmitt trigger circuit 54 having outputs 55 and 56 coupled to an emitter follower 57. Prior to the point of time at which the applied signal passes the reference voltage level, amplifier 51 causes the Schmitt trigger circuit 54 to control the emitter follower 57 through output line 55 to assume a first output state. When the applied signal to terminal 23 passes the reference voltage level, the Schmitt trigger circuit 54 is activated to transmit a trigger pulse through connector 56 to the emitter follower 57 to change the output state of the emitter follower 57 to thereby provide the transition in output state of the entire comparator circuit.

Obviously many modifications and variations of the present invention are possible in light of the above teachings. It is therefore to be understood that the invention can be practiced otherwise than as specifically described.

We claim:

1. In an instrument for measuring the voltage-time characteristic of an applied signal having a magnitude which varies as a function of time, to produce a transition in output state at each instant of time at which the magnitude of the applied signal exceeds the magnitude of a fixed, level setting voltage, the combination comprising:
   a. means responsive to an input command to select the magnitude at which the level setting voltage is to produced;
   b. a controller coupled to said means and responsive to the magnitude selected for the level setting voltage, said controller producing a digital signal representing the level setting voltage;
   c. converter means coupled to said controller and responsive to the digital signal for converting said digital signal to an analog voltage;
   d. display means coupled to said controller and responsive to the digital signal representing the level setting voltage for displaying its numeric value; and
   e. comparator means having a first input coupled to the output of said converter means for receiving said level setting voltage and a second input coupled to receive said applied signal, whereby said comparator means produces a transition in output state at the point of time at which the magnitude of the applied signal passes the magnitude of the level setting voltage.

2. The invention as defined by claim 1 wherein said means responsive to an input command includes a keyboard by which an operator may manually type in the magnitude of the level setting voltage desired.

3. The invention as defined by claim 1 wherein said controller includes a microprocessor.

4. The invention as defined by claim 1 wherein said converter means includes a shift register for transforming said digital signal from serial to parallel form, a digital to analog converter coupled to said shift register and responsive to said digital signal in parallel form for producing a direct current proportional to the level setting voltage, and a current responsive operational amplifier responsive to said direct current for producing the level setting voltage.

5. The invention as described in claim 1 and wherein said comparator means includes:
   a first amplifier coupled to the output of said converter means for receiving said level setting voltage and a second amplifier coupled to receive said applied signal;
   a Schmitt trigger circuit coupled to the outputs of each said amplifiers and having a pair of output states each having opposite binary polarities and operative to change binary polarities at the point in time at which the magnitude of the applied signal passes the magnitude of the level setting voltage; and
   an emitter follower coupled to both output states of said Schmitt trigger circuit for providing a transition in output state at the point of time at which the magnitude of the applied signal passes the magnitude of the level setting voltage.

6. In an instrument for measuring the time displacement between the point of time at which an applied signal passes a first reference voltage level and the point of time at which the applied signal passes a second reference voltage level, the combination comprising:
   a. a selector means for selecting the magnitude of said first reference voltage level and said second reference voltage level;
   b. computer means coupled to said selector means and responsive to the magnitude of said first and second reference voltage levels for producing first and second digital signals representing said first and second reference voltage levels respectively;
   c. display means coupled to said computer means for displaying the numeric value of said first and second reference voltage levels;
   d. a pair of channels each having an input coupled to the output of said computer means with said first channel being adapted to receive said first digital signal, convert it to an analog signal and compare it to the applied signal to provide a transition in output state of said first channel at the point of time at which the applied signal passes the first reference voltage level, and said second channel being adapted to receive said second digital signal, convert it to an analog signal and compare it to an applied signal to provide a transition in output state of said second channel at the point of time at which the applied signal passes the second reference voltage level.

7. The instrument as described in claim 6 and further including a pair of attenuators each coupled to the output of said computer means and each coupled to one of said pair of channels for attenuating the applied signal coupled to the associated channel.

8. The instrument as described in claim 6 and wherein said selector means includes a keyboard having a plurality of keys for selecting the magnitude of said first and second reference voltage levels.

9. The instrument as described in claim 8 and wherein said keyboard includes slope annunciator means for controlling whether the point of time at which the applied signal passes the first reference voltage level occurs when the applied signal increases or decreases past the first reference voltage level, and for controlling whether the point of time at which the applied signal passes the second reference voltage level occurs when the applied signal increases or decreases past the second reference voltage level.

10. The instrument as described in claim 6 and further including counter means coupled to the output of said pair of channels for producing a chain of regularly recurring pulses beginning at the point of time at which the applied signal passes the first reference voltage level and terminating at the point of time at which the applied signal passes the second reference voltage level.

* * * * *